(12) United States Patent
Tokuda et al.

(10) Patent No.: US 11,869,543 B2
(45) Date of Patent: Jan. 9, 2024

(54) DISK DEVICE WITH HEAT DISSIPATION LAYER TO SUPPRESS EXCESSIVE HEATING

(71) Applicants: Kabushiki Kaisha Toshiba, Tokyo (JP); Toshiba Electronic Devices & Storage Corporation, Tokyo (JP)

(72) Inventors: Kota Tokuda, Fujisawa Kanagawa (JP); Nobuhiro Yamamoto, Yokohama Kanagawa (JP); Taichi Okano, Yokohama Kanagawa (JP); Yoshihiro Amemiya, Chigasaki Kanagawa (JP); Shinra Yamanaka, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/942,439

(22) Filed: Sep. 12, 2022

(65) Prior Publication Data
US 2023/0206957 A1 Jun. 29, 2023

(30) Foreign Application Priority Data
Dec. 24, 2021 (JP) .................................. 2021-211073

(51) Int. Cl.
*G11B 33/12* (2006.01)
*H05K 1/11* (2006.01)
(Continued)

(52) U.S. Cl.
CPC .......... *G11B 33/122* (2013.01); *G06F 3/0676* (2013.01); *G11B 5/54* (2013.01);
(Continued)

(58) Field of Classification Search
None
See application file for complete search history.

(56) References Cited

U.S. PATENT DOCUMENTS

| 5,055,969 A | * | 10/1991 | Putnam | ................. | G11B 5/486 360/264.2 |
| 6,038,102 A | * | 3/2000 | Balakrishnan | ......... | G11B 5/486 360/264.2 |

(Continued)

FOREIGN PATENT DOCUMENTS

| JP | S64-064389 A | 3/1989 |
| JP | 2001-085827 A | 3/2001 |
| JP | 2001-326429 A | 11/2001 |

*Primary Examiner* — William J Klimowicz
(74) *Attorney, Agent, or Firm* — Allen & Overy LLP

(57) ABSTRACT

According to one embodiment, a disk device includes a magnetic disk, a magnetic head, a first FPC, and a second FPC. The first FPC includes first terminals. The magnetic head is mounted on the first FPC and electrically connected to at least one of the first terminals. The second FPC includes a surface, second terminals on the surface, and a first ground plane. The second terminals are individually bonded to the corresponding first terminals with a conductive bonding material. The first ground plane covers at least one of the second terminals in a direction orthogonal to the surface. The second terminals include a first read terminal through which an electric signal representing information read from the magnetic disk by the magnetic head passes. The first ground plane is located apart from at least a part of the first read terminal in a direction along the surface.

11 Claims, 5 Drawing Sheets

(51) Int. Cl.
*G06F 3/06* (2006.01)
*G11B 5/54* (2006.01)
*G11B 33/02* (2006.01)

(52) U.S. Cl.
CPC ............ *H05K 1/118* (2013.01); *G11B 33/022* (2013.01); *G11B 2220/2516* (2013.01)

(56) References Cited

U.S. PATENT DOCUMENTS

| | | | |
|---|---|---|---|
| 6,275,358 B1* | 8/2001 | Balakrishnan | G11B 5/4853 360/264.2 |
| 7,781,679 B1* | 8/2010 | Schreiber | H05K 3/44 360/245.9 |
| 8,004,798 B1* | 8/2011 | Dunn | G11B 5/4833 360/245.9 |
| 11,074,931 B1* | 7/2021 | Aoki | G11B 25/043 |
| 2003/0086214 A1* | 5/2003 | Shin | G11B 5/486 |
| 2007/0002501 A1* | 1/2007 | Honda | G11B 5/4826 |
| 2016/0012837 A1* | 1/2016 | Arai | G11B 5/4846 360/245.9 |
| 2018/0235087 A1* | 8/2018 | Uchida | H05K 3/3463 |
| 2018/0277150 A1* | 9/2018 | Kikuchi | H05K 1/028 |
| 2019/0295600 A1* | 9/2019 | Yoshikawa | G11B 5/4853 |
| 2020/0305280 A1* | 9/2020 | Tokuda | H05K 1/113 |
| 2022/0076697 A1* | 3/2022 | Sato | H01R 12/61 |

* cited by examiner

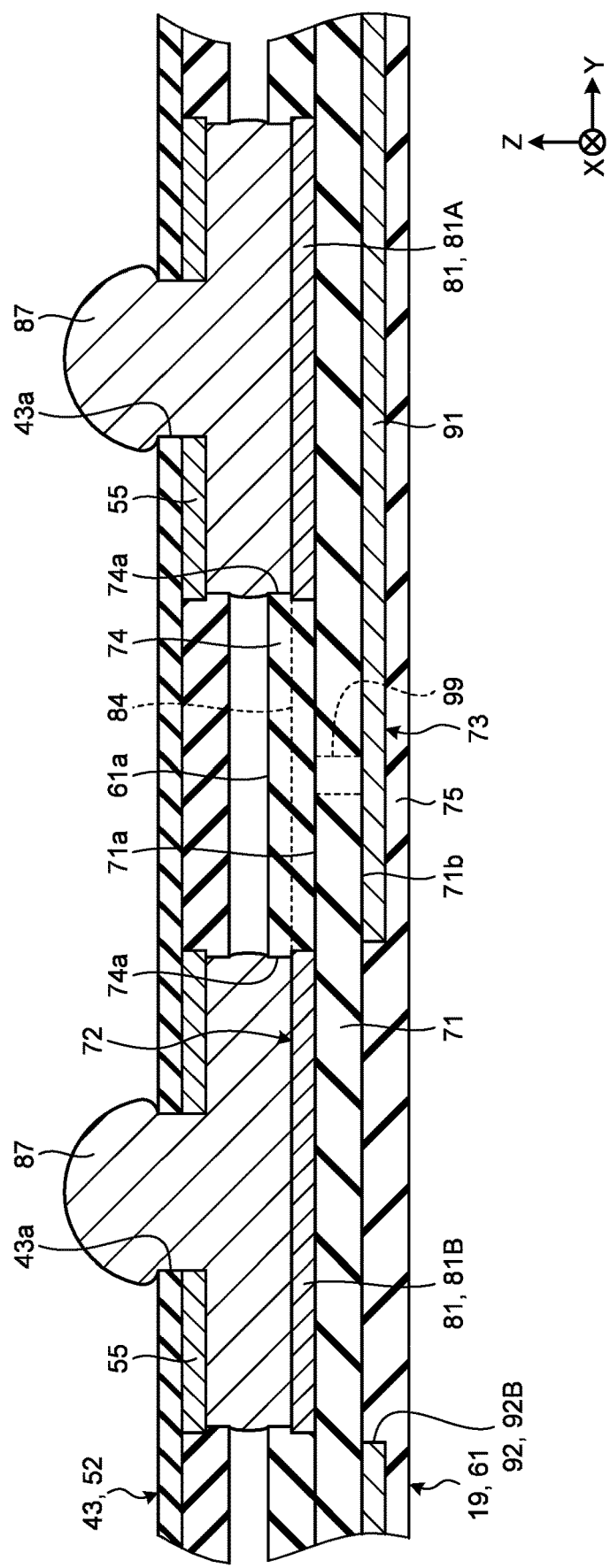

DISK DEVICE WITH HEAT DISSIPATION LAYER TO SUPPRESS EXCESSIVE HEATING

CROSS-REFERENCE TO RELATED APPLICATIONS

This application is based upon and claims the benefit of priority from Japanese Patent Application No. 2021-211073, filed on Dec. 24, 2021, the entire contents of which are incorporated herein by reference.

FIELD

Embodiments described herein relate generally to a disk device.

BACKGROUND

A disk device such as a hard disk drive (HDD) includes magnetic disks and magnetic heads that read and write information from and to the magnetic disks. Such a HDD further includes, for example, a plurality of flexible printed circuit boards (FPC) that electrically connects the magnetic heads and a control device for controlling the HDD. Two FPCs are connected to each other by bonding terminals of the two FPCs by soldering.

In bonding the terminals of the two FPCs by soldering, the solder is heated by laser light, for example. The laser light heats the periphery of the terminals through the solder. Overheating the periphery of the terminals may cause a peel-off of the FPCs.

BRIEF DESCRIPTION OF THE DRAWINGS

FIG. 5 is an exemplary sectional view schematically illustrating a part of the FPC and a part of the flexure in the above embodiment along a line F5-F5 of FIG. 4.

DETAILED DESCRIPTION

In general, according to one embodiment, a disk device includes a magnetic disk, a magnetic head, a first flexible printed circuit board, and a second flexible printed circuit board. The magnetic head is configured to read and write information from and to the magnetic disk. The first flexible printed circuit board includes a plurality of first terminals. The magnetic head is mounted on the first flexible printed circuit board and electrically connected to at least one of the plurality of first terminals. The second flexible printed circuit board includes a surface, a plurality of second terminals on the surface, and a first ground plane. The plurality of second terminals is individually bonded to the corresponding first terminals with a conductive bonding material. The first ground plane covers at least one of the plurality of second terminals in a direction orthogonal to the surface. The plurality of second terminals includes a first read terminal through which an electric signal representing information read from the magnetic disk by the magnetic head passes. The first ground plane is located apart from at least a part of the first read terminal in a direction along the surface.

In the following, one embodiment will be described with reference to FIG. 1 to FIG. 5. Note that a component according to an embodiment and a description of the component may be described in a plurality of kinds of expression in the present specification. A component and a description thereof are examples and are not limited by expression in the present specification. A component may be specified by a name different from that in the present specification. In addition, a component may be described by expression different from expression in the present specification.

Figure 1:
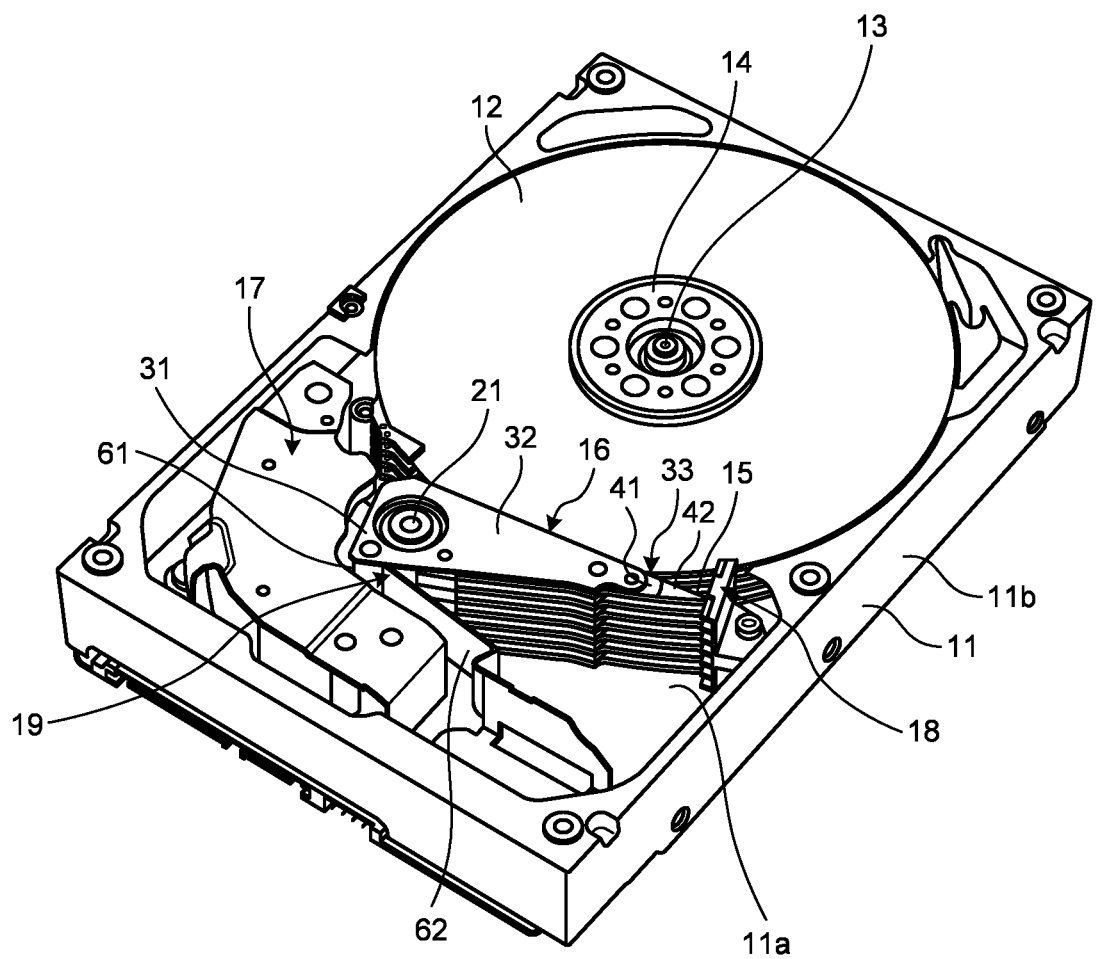
FIG. 1 is an exemplary perspective view schematically illustrating a hard disk drive according to one embodiment.

FIG. 1 is an exemplary perspective view schematically illustrating a hard disk drive (HDD) 1 according to one embodiment. The HDD 1 is an example of a disk device. Note that the disk device is not limited to the HDD 1, and may be another disk device such as a hybrid hard disk drive.

As illustrated in FIG. 1, the HDD 1 includes a housing 11, a plurality of magnetic disks 12, a spindle motor 13, a clamp spring 14, a plurality of magnetic heads 15, an actuator assembly 16, a voice coil motor (VCM) 17, a ramp load mechanism 18, and a flexible printed circuit board (FPC) 19. The FPC 19 is an example of a second flexible printed circuit board.

The housing 11 has a bottom wall 11a of a plate shape and a side wall 11b protruding from an outer edge of the bottom wall 11a. The housing 11 further includes a cover that is attached to the side wall 11b and that covers the inside of the housing 11. At least a part of the magnetic disks 12, the spindle motor 13, the clamp spring 14, the magnetic heads 15, the actuator assembly 16, the VCM 17, the ramp load mechanism 18, and the FPC 19 is housed in the housing 11.

Each of the magnetic disks 12 is, for example, a disk having a magnetic recording layer provided on at least one of an upper surface and a lower surface. A diameter of the magnetic disks 12 is, for example, 3.5 inches, but is not limited to this example.

The spindle motor 13 supports and rotates the plurality of magnetic disks 12 stacked at intervals. The clamp spring 14 holds the plurality of magnetic disks 12 on a hub of the spindle motor 13.

The magnetic heads 15 record and reproduce information on and from the recording layers of the magnetic disks 12. In other words, the magnetic heads 15 read and write information from and to the magnetic disks 12. The magnetic heads 15 are supported by the actuator assembly 16.

The actuator assembly 16 is rotatably supported by a supporting shaft 21 arranged at a position separated from the magnetic disks 12. The VCM 17 rotates the actuator assembly 16 and places the actuator assembly 16 at a desired position. When the magnetic heads 15 move to the outermost periphery of the magnetic disks 12 by the rotation of the actuator assembly 16 by the VCM 17, the ramp load mechanism 18 holds the magnetic heads 15 at an unload position separated from the magnetic disks 12.

A printed circuit board (PCB) is attached to the outside of the bottom wall 11a of the housing 11. A control device that controls the spindle motor 13, the magnetic heads 15, and the VCM 17 is mounted on the PCB.

The control device includes various electronic components such as a read/write channel (RWC), a hard disk controller (HDC), a processor, a RAM, a ROM, a buffer memory, and a servo combo IC. The control device is electrically connected to the magnetic heads 15 and the VCM 17 through the FPC 19.

The actuator assembly 16 includes an actuator block 31, a plurality of arms 32, and a plurality of head suspension assemblies 33. The head suspension assemblies 33 may also be referred to as head gimbal assemblies (HGA).

The actuator block 31 is rotatably supported by the supporting shaft 21 through a bearing, for example. The plurality of arms 32 protrudes from the actuator block 31 in a direction substantially orthogonal to the supporting shaft 21. Note that an actuator assembly 16 may be divided and a plurality of arms 32 may respectively protrude from of a plurality of actuator blocks 31.

The plurality of arms 32 is arranged at intervals in a direction in which the supporting shaft 21 extends. Each of the arms 32 has a plate shape to enter between adjacent magnetic disks 12. The plurality of arms 32 extends substantially in parallel.

A voice coil of the VCM 17 is provided on a protrusion protruding from the actuator block 31. The VCM 17 includes a pair of yokes, a voice coil arranged between the yokes, and a magnet provided on each of the yokes.

Each of the head suspension assemblies 33 is attached to a tip portion of a corresponding arm 32 and protrudes from the arm 32. As a result, the plurality of head suspension assemblies 33 is arranged at intervals in the direction in which the supporting shaft 21 extends.

Figure 2:
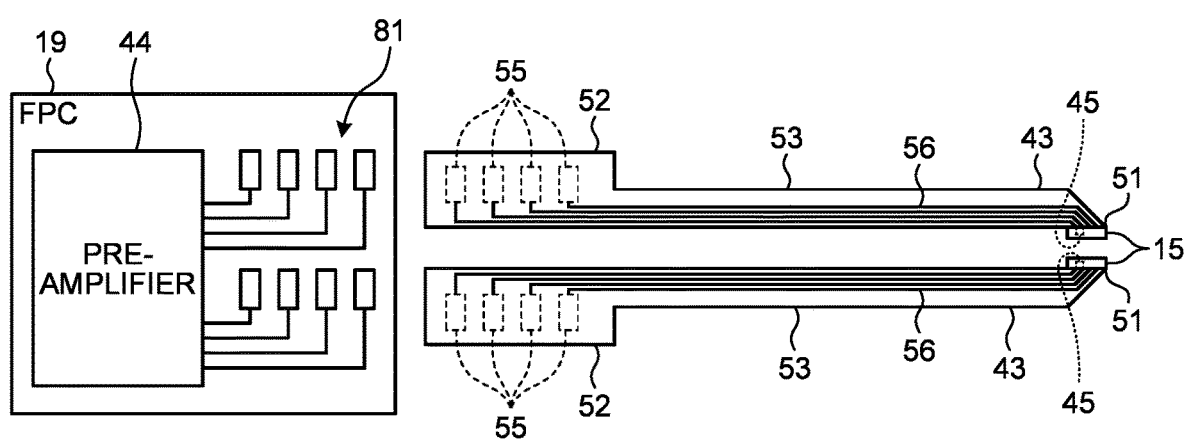
FIG. 2 is an exemplary view schematically illustrating an FPC and flexure in the above embodiment.

FIG. 2 is an exemplary view schematically illustrating the FPC 19 and a flexure 43 in the present embodiment. Each of the plurality of head suspension assemblies 33 includes a base plate 41 and a load beam 42 illustrated in FIG. 1, and a flexure 43, a preamplifier 44, and a high density interconnected (HDI) sensor 45 illustrated in FIG. 2. Furthermore, the magnetic heads 15 are respectively attached to the head suspension assemblies 33. The flexure 43 is an example of a first flexible printed circuit board, and may also be referred to as a relay FPC. The preamplifier 44 may also be referred to as a head IC or a head amplifier.

The base plate 41 in FIG. 1 is attached to a tip portion of each of the arms 32. The load beam 42 has a plate shape thinner than the base plate 41. The load beam 42 is attached to a tip portion of the base plate 41 and protrudes from the base plate 41.

As illustrated in FIG. 2, the flexure 43 has an elongated belt shape. Note that the shape of the flexure 43 is not limited to this example. The flexure 43 is, for example, a multilayer plate including a metal plate (backing layer) made of stainless steel or the like, an insulating layer formed on the metal plate, a conductive layer formed on the insulating layer and forms a plurality of wires (wiring patterns), and a protective layer (insulating layer) covering the conductive layer. The flexure 43 includes a first attachment portion 51, a second attachment portion 52, and an intermediate portion 53.

The first attachment portion 51 is provided at one end of the flexure 43. The second attachment portion 52 is provided at the other end of the flexure 43. The intermediate portion 53 extends between the first attachment portion 51 and the second attachment portion 52.

The first attachment portion 51 is attached to the base plate 41 and the load beam 42. The first attachment portion 51 has a displaceable gimbal (elastic support) that is placed above the load beam 42. Each of the magnetic heads 15 is mounted on the gimbal.

The intermediate portion 53 protrudes from the first attachment portion 51 to the outside of a side edge of the base plate 41. The intermediate portion 53 extends toward the actuator block 31 along a side edge of the arms 32 outside the base plate 41.

The second attachment portion 52 has a rectangular shape extending in a longitudinal direction of the intermediate portion 53. The second attachment portion 52 includes a plurality of pads 55. The pads 55 are examples of a first terminal. The pads 55 are arranged at intervals in a longitudinal direction of the second attachment portion 52 and configure flying leads.

The flexure 43 further includes a plurality of wires 56. The pads 55 and the wires 56 are provided on the conductive layer of the flexure 43. The wires 56 extend between the first attachment portion 51 and the second attachment portion 52 through the intermediate portion 53. The plurality of wires 56 electrically connects at least one of the plurality of pads 55 to a read element, a write element, a heater, or another component of the corresponding magnetic head 15. In other words, the wires 56 extend between the pads 55 and an electrode connected to the magnetic head 15, and form at least a part of an electrical path between the pads 55 and the magnetic head 15.

Figure 3:
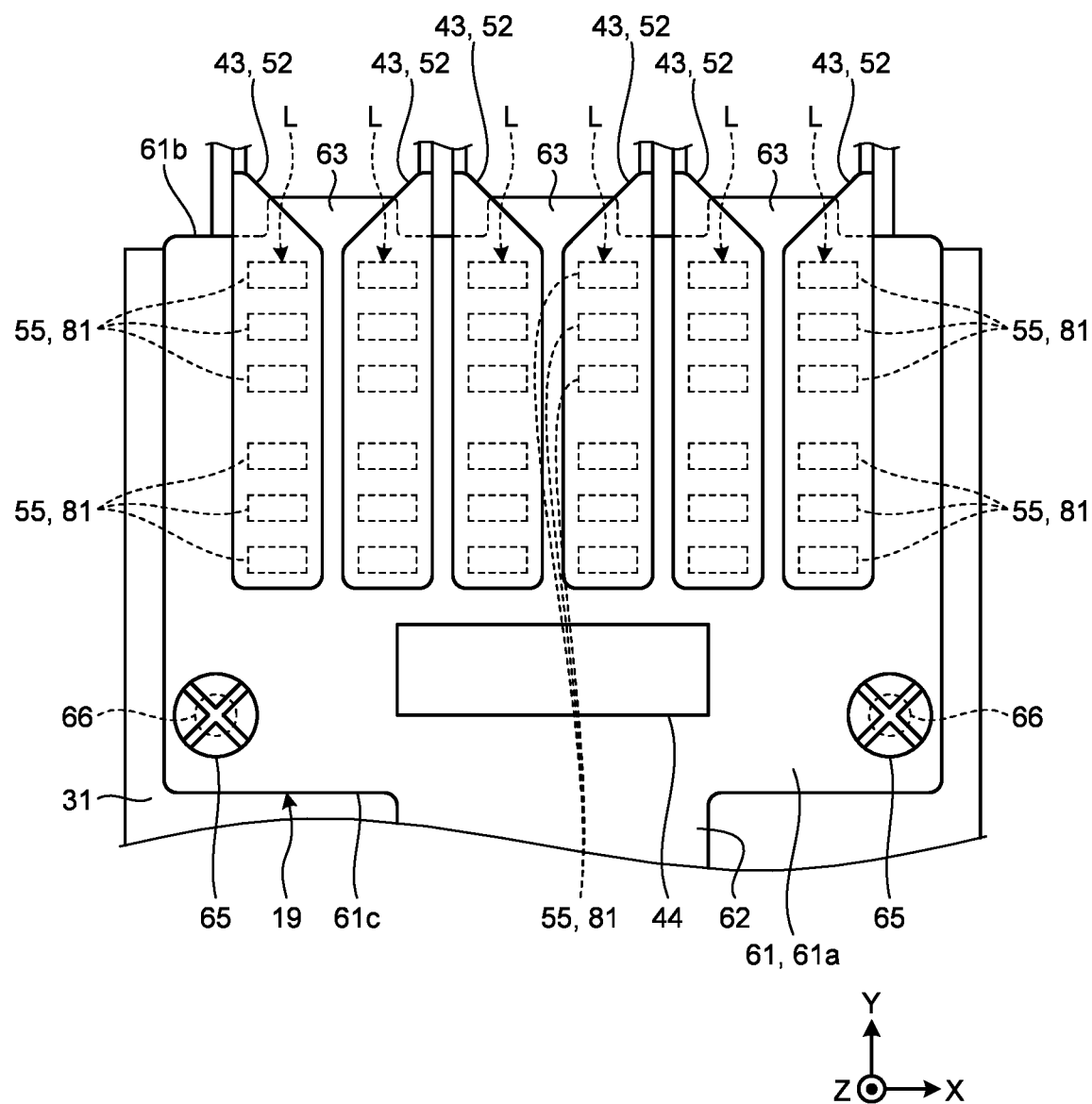
FIG. 3 is an exemplary plan view schematically illustrating a part of the FPC and a part of the flexure in the above embodiment.

FIG. 3 is an exemplary plan view schematically illustrating a part of the FPC 19 and a part of the flexure 43 in the present embodiment. As illustrated in FIG. 3, the FPC 19 includes a joint portion 61, an extension portion 62, and a plurality of protrusions 63.

The joint portion 61 is attached to the actuator block 31 by, for example, a plurality of screws 65. A plurality of insertion holes 66 through which the screws 65 pass is provided in the joint portion 61. The extension portion 62 extends between the joint portion 61 and the above-described PCB on which the control device is mounted. The plurality of protrusions 63 protrudes from the joint portion 61.

The second attachment portions 52 of the plurality of flexures 43 are attached to the joint portion 61 of the FPC 19. The FPC 19 electrically connects the above-described PCB on which the control device is mounted and the flexures 43. That is, the control device is electrically connected to the magnetic heads 15 through the PCB, the FPC 19, and the flexures 43.

Figure 4:
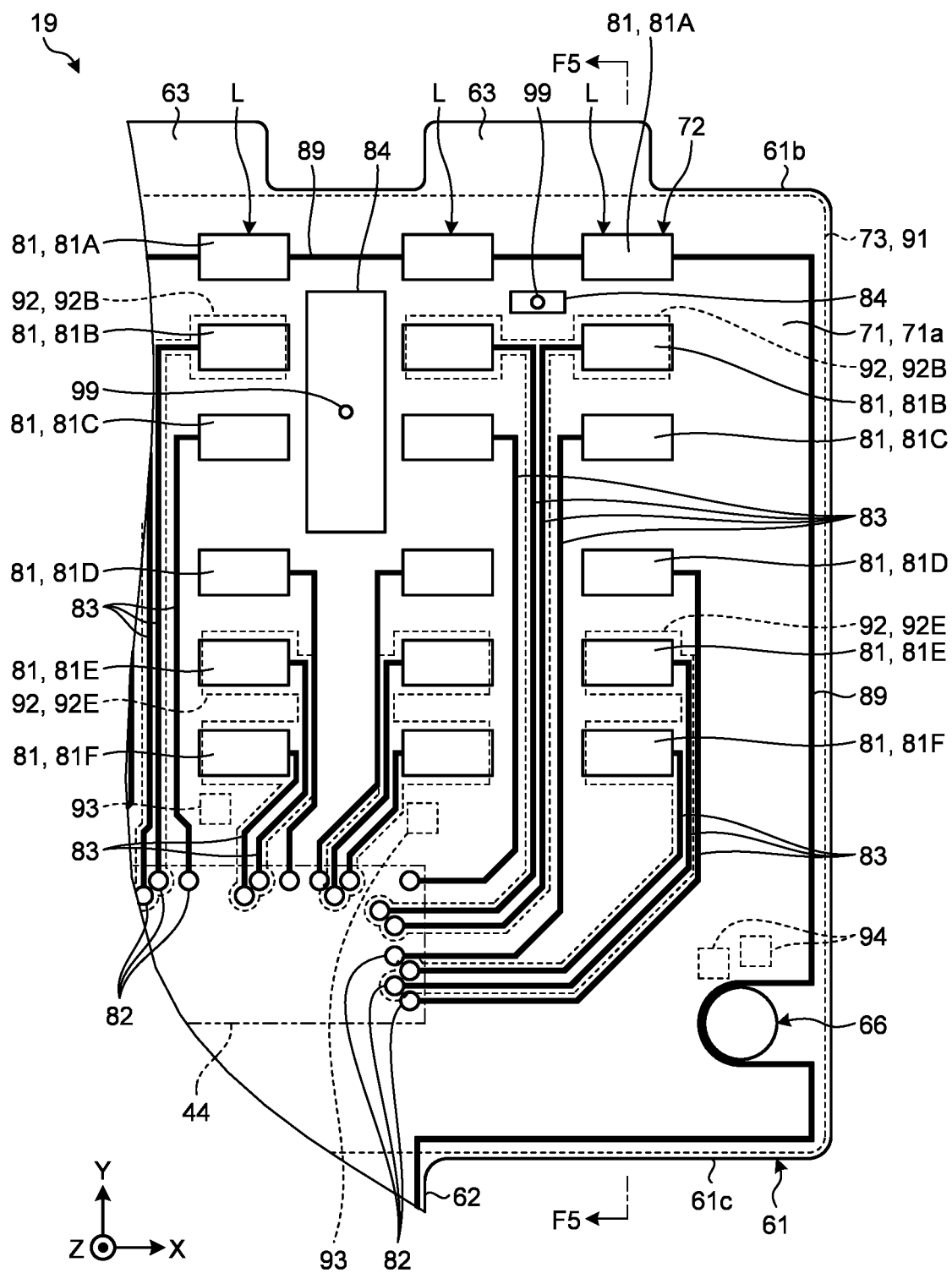
FIG. 4 is an exemplary plan view schematically illustrating a part of the FPC in the above embodiment.

FIG. 4 is an exemplary plan view schematically illustrating a part of the FPC 19 of the present embodiment. FIG. 5 is an exemplary sectional view schematically illustrating a part of the FPC 19 and a part of the flexure 43 in the present embodiment along a line F5-F5 of FIG. 4.

As illustrated in FIG. 5, the FPC 19 includes, for example, a base layer 71, two conductive layers 72 and 73, and two cover layers 74 and 75. In addition, the FPC 19 includes an adhesive layer between two or more layers. Note that the FPC 19 is not limited to this example, and may have fewer layers or more layers.

The base layer 71 and the cover layers 74 and 75 are, for example, flexible and insulating films, and are made of a synthetic resin such as polyester or polyimide. The base layer 71 has two faces 71a and 71b provided on opposite sides. The face 71b faces the actuator block 31.

The conductive layers 72 and 73 are made of, for example, a conductive metal such as copper. The conductive layer 72 is laminated on the face 71a of the base layer 71. The conductive layer 73 is laminated on the face 71b of the base layer 71. Thus, the base layer 71 is located between the two conductive layers 72 and 73.

The cover layer 74 is laminated on the face 71a of the base layer 71 and the conductive layer 72. That is, the cover layer 74 covers at least a part of the face 71a of the base layer 71 and at least a part of the conductive layer 72.

The cover layer 75 is laminated on the face 71b of the base layer 71 and the conductive layer 73. That is, the cover layer 75 covers at least a part of the face 71b of the base layer 71 and at least a part of the conductive layer 73. Thus, the base layer 71 is located between the two cover layers 74 and 75. Note that the cover layer 74 is omitted in FIG. 4 for the sake of description.

In the joint portion 61, a metal plate (backing layer) made of aluminum or the like is attached to the cover layer 75 of the FPC 19. Thus, the joint portion 61 is formed to be substantially flat. The joint portion 61 is attached to the actuator block 31 through a metal plate. As illustrated in FIG. 1, by bending, the extension portion 62 can absorb displacement of the joint portion 61 due to the rotation of the actuator assembly 16.

As illustrated in FIG. 3, the joint portion 61 of the FPC 19 has a surface 61a and two edges 61b and 61c. The surface 61a is one surface of the joint portion 61, and is formed by, for example, the cover layer 74, and the conductive layer 72 and the base layer 71 exposed by a hole in the cover layer 74. Note that the surface 61a may be formed by another portion.

As illustrated in a plurality of drawings including FIG. 3, an X axis, a Y axis, and a Z axis are defined for convenience in the present specification on the assumption that the surface 61a is flat. The X axis, the Y axis, and the Z axis are orthogonal to each other. The X axis is provided along a width of the surface 61a. The Y axis is provided along a length of the surface 61a. The Z axis is provided in a manner of being orthogonal to the surface 61a.

Moreover, an X direction, a Y direction, and a Z direction are defined in the present specification. The X direction is a direction along the X axis, and includes a +X direction indicated by an arrow of the X axis and a −X direction that is an opposite direction of the arrow of the X axis. The Y direction is a direction along the Y axis, and includes a +Y direction indicated by an arrow of the Y axis and −Y direction that is an opposite direction of the arrow of the Y axis. The Z direction is a direction along the Z axis, and includes a +Z direction indicated by an arrow of the Z axis and a −Z direction that is an opposite direction of the arrow of the Z axis.

The X direction and the Y direction are directions along the surface 61a. The X direction and the Y direction intersect with (in the present embodiment, are orthogonal to) each other. The Z direction is a direction orthogonal to the surface 61a. The X direction is an example of a second direction. The Y direction is an example of a first direction and a third direction. Note that an arrangement of each element in the direction along the surface 61a in the following description is equal to an arrangement of each element of a case of being viewed in the direction orthogonal to the surface 61a.

The joint portion 61 may be bent in such a manner that the surface 61a has a curved shape or the surface 61a has a recess/protrusion. In this case, the X direction is a width direction of the joint portion 61 which direction is along the surface 61a, and the Y direction is a length direction of the joint portion 61 which direction is along the surface 61a.

The edge 61b of the joint portion 61 is at an end of the joint portion 61 in the +Y direction. The edge 61c of the joint portion 61 is at an end of the joint portion 61 in the −Y direction. The two edges 61b and 61c extend substantially in parallel in the X direction. The plurality of protrusions 63 protrudes substantially in the +Y direction from the edge 61b. The plurality of protrusions 63 is arranged at intervals in the X direction. The extension portion 62 extends substantially in the −Y direction from the edge 61c.

As illustrated in FIG. 4, in the joint portion 61, the conductive layer 72 includes a plurality of connection pads 81, a plurality of mounting pads 82, a plurality of wires 83, and a plurality of ground planes 84. The ground planes 84 are examples of a second ground plane. The ground planes 84 may also be referred to as solid plane patterns or solid plane grounds.

The connection pads 81 and the mounting pads 82 are placed on the surface 61a. Specifically, as illustrated in FIG. 5, the connection pads 81 and the mounting pads 82 are exposed to the outside of the FPC 19 through a plurality of holes 74a in the cover layer 74. In this manner, the connection pads 81 and the mounting pads 82 are mounted on the surface 61a.

As illustrated in FIG. 4, the plurality of connection pads 81 is closer to the edge 61b of the joint portion 61 than the plurality of mounting pads 82. The plurality of mounting pads 82 is placed between the plurality of connection pads 81 and the extension portion 62. In addition, the plurality of connection pads 81 is closer to the edge 61b of the joint portion 61 than the screws 65.

In the example of FIG. 3, the plurality of connection pads 81 is arranged in six rows in the Y direction. In other words, the plurality of connection pads 81 forms six rows L. In the example of FIG. 3, each of the rows L includes six connection pads 81 arranged in the Y direction among the plurality of connection pads 81. Note that the number of rows L of the connection pads 81 and the number of the plurality of connection pads 81 included in each row L are not limited to this example.

In each row L, the plurality of connection pads 81 is arranged at intervals in the Y direction. Furthermore, the plurality of rows L of the connection pads 81 is arranged at intervals in the X direction. The number of the connection pads 81 in each row L corresponds to, for example, functions of the magnetic heads 15.

Hereinafter, the connection pads 81 included in each row may be individually referred to as connection pads 81A, 81B, 81C, 81D, 81E, and 81F as illustrated in FIG. 4. In other words, the plurality of connection pads 81 includes the connection pads 81A, 81B, 81C, 81D, 81E, and 81F.

The connection pad 81B is an example of a write terminal. The connection pad 81E is an example of an HDI terminal. The connection pad 81F is an example of a first read terminal.

The plurality of connection pads 81A, 81B, 81C, 81D, 81E, and 81F is arranged in order in the Y direction. The connection pad 81A is closer to the edge 61b of the joint portion 61 than the plurality of other connection pads 81B, SIC, 81D, 81E, and 81F. The connection pad 81F is closer to the edge 61c of the joint portion 61 than the plurality of other connection pads 81A, 81B, 81C, 81D, and 81E.

The plurality of connection pads 81A is arranged at intervals in the X direction. The plurality of connection pads 81B is separated from the plurality of connection pads 81A in the −Y direction and is arranged at intervals in the X direction. Similarly, the plurality of connection pads 81C, 81D, 81E, and 81F is separated from the plurality of adjacent connection pads 81 in the −Y direction and is arranged at intervals in the X direction.

One of the connection pads 81A and corresponding connection pads 81B, 81C, 81D, 81E, and 81F are arranged at substantially the same position in the X direction. Note that the positions in the X direction of the corresponding connection pads 81A, 81B, 81C, 81D, 81E, and 81F may be different from each other. In addition, the number of connection pads 81 in each row L may be different.

As illustrated in FIG. 5, the plurality of connection pads 81 on the FPC 19 is bonded to the corresponding pads 55 on the flexures 43 with the solder 87. The solder 87 has conductivity and is an example of a bonding material. The solder 87 is leaded solder or lead-free solder. A conductive adhesive is not limited to the solder 87, and may be, for example, a silver paste, wax, or a conductive adhesive.

As illustrated in FIG. 3, the second attachment portion 52 of each of the flexures 43 extends in the Y direction across the edge 61b of the Mint portion 61 and covers the row L of the corresponding connection pads 81. The plurality of pads 55 of one flexure 43 is connected to the plurality of connection pads 81 included in one row L.

The preamplifier 44 is mounted on the surface 61a of the joint portion 61. Specifically, electrodes of the preamplifier 44 are joined to the plurality of mounting pads 82 by, for example, solder. That is, the plurality of mounting pads 82 is connected to the preamplifier 44. Thus, the plurality of connection pads 81 is located between the edge 61b and the preamplifier 44 in the direction along the surface 61a.

As illustrated in FIG. 4, each of the plurality of wires 83 connects corresponding one of the plurality of connection pads 81B, 81C, 81D, 81E, and 81F and corresponding one of the plurality of mounting pads 82. Note that an electric path between the connection pad 81 and the mounting pad 82 may include the wire 83, a wire included in the conductive layer 73, and a via.

The preamplifier 44 is electrically connected to the magnetic heads 15 through the mounting pads 82, the wires 83, the connection pads Si, the solder 87, the pads 55, and the wires 56. On the other hand, the plurality of connection pads 81A is connected to each other by, for example, another wire 89, and is connected to the PCB through a driver mounted on the FPC 19, for example.

The preamplifier 44 is electrically connected to the write elements of the magnetic heads 15 through the connection pads 81B. That is, the connection pads 81B are allocated to electric signals (write signals) representing information to be written by the magnetic heads 15 into the magnetic disks 12.

The preamplifier 44 amplifies a write signal output from the control device. The preamplifier 44 outputs the amplified write signal to the write element of the corresponding magnetic head 15 through the corresponding connection pad 81B. The write element writes information to the magnetic disk 12 on the basis of the write signal. In such a manner, the write signal passes through the connection pad 81B from the preamplifier 44 toward the magnetic head 15.

The preamplifier 44 is electrically connected to the heaters of the magnetic heads 15 through the connection pads 81C. The heater of each of the magnetic heads 15 adjusts positions of the write element and the read element of the magnetic head 15 with respect to a corresponding magnetic disk 12 by adjusting a temperature of the magnetic head 15.

The preamplifier 44 is electrically connected to microwave-assisted magnetic recording (MAMR) elements of the magnetic heads 15 through the connection pads 81D. The MAMR element of each of the magnetic heads 15 superimposes a microwave on a recording magnetic field of the write element and performs application thereof to a corresponding magnetic disk 12.

Through the connection pads 81E, the preamplifier 44 is electrically connected to HDI sensors 45 incorporated in the magnetic heads 15. That is, the connection pads 81E are electrically connected to the HDI sensors 45. The HDI sensors 45 incorporated in the magnetic heads 15 are mounted on the flexures 43.

Each of the HDI sensors 45 includes, for example, a thermocouple, detects contact between a corresponding magnetic disk 12 and a corresponding magnetic head 15, and outputs an electric signal (detection signal). For example, a resistance value of the thermocouple changes according to heat generated by the contact between the magnetic disk 12 and the magnetic head 15. The HDI sensor 45 outputs a detection signal corresponding to the resistance value of the thermocouple. Note that the HDI sensor 45 is not limited to this example. The detection signals pass through the connection pads 81E and are transmitted to the control device through the preamplifier 44.

The preamplifier 44 is electrically connected to the read elements of the magnetic heads 15 through the connection pads 81F. That is, the connection pads 81F are allocated to electric signals (read signals) representing information read by the magnetic head 15 from the magnetic disk 12.

The read elements of the magnetic heads 15 input the read signals to the preamplifier 44 through the connection pads 81F. The preamplifier 44 amplifies the read signals and transmits the amplified read signals to the control device. In such a manner, the read signals pass through the connection pads 81F from the magnetic heads 15 toward the preamplifier 44.

The control device is electrically connected to gimbal micro actuators (GNA) through the connection pads 81A. That is, the connection pads 81A are allocated to the GMAs. For example, the control device deforms the load beams 42 by driving the GMAs, and finely adjusts positions of the magnetic heads 15.

The ground planes 84 are metal films spreading on the surface 61a. The ground planes 84 are set to ground potential. The ground planes 84 are apart from the connection pads 81, the mounting pads 82, and the wires 83 in the direction along the surface 61a. Note that the ground planes 84 may be connected to the connection pads 81, the mounting pads 82, and the wires 83 allocated to the ground.

Each of the ground planes 84 is placed, for example, in a region including no wires 83 between two adjacent rows L. In other words, at least a part of each ground plane 84 is located between two of the connection Pads 81 in the direction along the surface 61a. Note that the ground planes 84 may be provided in other locations.

The ground planes 84 are closer to the edge 61b than the edge 61c of the joint portion 61. The ground planes 84 are separated from the protrusions 63. Note that the ground planes 84 may be provided in a region closer to the edge 61c than the edge 61b, or may be provided in the protrusions 63.

In the joint portion 61, the conductive layer 73 has a ground plane 91. The ground plane 91 is an example of a first ground plane. The ground plane 91 is a metal film extending along the surface 61a. The ground plane 91 is set to the ground potential.

The ground plane 91 covers the plurality of connection pads 81A, 81C, and 81D in the Z direction. In other words, the ground plane 91 overlaps with the plurality of connection pads 81A, 81C, and 81D in the Z direction.

Furthermore, the ground plane 91 covers the mounting pads 82 and the wires 83 connected to the connection pads 81A, 81C, and 81D in the Z direction. In addition, the ground plane 91 covers the ground planes 84 in the Z direction. In such a manner, the ground plane 91 covers at least one of the connection pads 81, at least one of the mounting pads 82, and at least one of the wires 83 in the Z direction.

In the Y direction, a part of the ground plane 91 is placed between the connection pads 81A and the edge 61b of the joint portion 61. An end of the ground plane 91 in the +Y direction is placed in the vicinity of the edge 61b. In the Y direction, another part of the ground plane 91 is placed between the connection pads 81F and the edge 61c of the joint portion 61. An end of the ground plane 91 in the −Y direction is placed in the vicinity of the edge 61c.

A plurality of holes 92, a plurality of first openings 93, and a plurality of second openings 94 are provided in the ground plane 91. The holes 92, the first openings 93, and the second openings 94 are holes penetrating through the ground plane 91 in the Z direction. Note that the first openings 93 and the second openings 94 may be cutouts.

The plurality of holes 92 includes a plurality of holes 92B and 92E. In the Z direction, each of the plurality of holes 92B overlaps with at least a part of a corresponding connection pad 81B and at least a part of the mounting pad 82 and the wire 83 connected to the connection pad 81B. In other words, each of the plurality of holes 92B has a portion overlapping with at least a part of the corresponding connection pad 81B in the Z direction, a portion overlapping with at least a part of one of the mounting pads 82 in the Z direction, and a portion overlapping with at least a part of one of the wires 83 in the Z direction.

In other words, in the direction along the surface 61a, at least a part of the connection pad 81B and at least a part of the mounting pad 82 and the wire 83 connected to the connection pad 81B are placed inside the edge of the hole 92B. From the above, in the direction along the surface 61a, the ground plane 91 is separated from at least a part of the connection pad 81B and at least a part of the mounting pad 82 and the wire 83 connected to the connection pad 81B.

In the Z direction, the plurality of holes 92E overlaps with at least a part of the corresponding connection pads 81E and at least a part of the mounting pad 82 and the wire 83 connected to the connection pad 81E. In other words, in the direction along the surface 61a, at least a part of the connection pad 81E and at least a part of the mounting pad 82 and the wire 83 connected to the connection pad 81E are located inside the edge of the hole 92E. Thus, in the direction along the surface 61a, the ground plane 91 is apart from at least a part of the connection pad 81E and at least a part of the mounting pad 82 and the wire 83 connected to the connection pad 81E.

Furthermore, in the Z direction, each of the plurality of holes 92E overlaps with at least a part of a corresponding connection pad 81F and at least a part of the mounting pad 82 and the wire 83 connected to the connection pad 81F. In other words, in the direction along the surface 61a, at least a part of the connection pad 81F and at least a part of the mounting pad 82 and the wire 83 connected to the connection pad 81F are placed inside the edge of the hole 92E. Thus, in the direction along the surface 61a, the ground plane 91 is separated from at least a part of the connection pad 81F and at least a part of the mounting pad 82 and the wire 83 connected to the connection pad 81F.

The wire 83 connected to the connection pad 81F is an example of a lead wire. The mounting pad 82 connected to the connection pad 81F through the wire 83 is an example of a second read terminal. Note that a hole different from the holes 92E may overlap in the Z direction with at least a part of a corresponding connection pad 81F and at least a part of the mounting pad 82 and the wire 83 connected to the connection pad 81F.

Instead of the holes 92, a cutout, or a region between a ground plane 91 divided into two may be provided. The cutout or the region also overlaps in the Z direction with at least a part of a corresponding connection pad 81 and at least a part of the mounting pad 82 and the wire 83 connected to the connection pad 81.

As described above, in the direction along the surface 61a, the ground plane 91 is at least partially away from a predetermined wire 83, and the connection pad 81 (81B, 81E, or 81F) and the mounting pad 82 connected to the predetermined wire 83. Furthermore, the ground plane 91 is away from at least a part of the connection pads 81B, 81E, and 81F in each row L in the direction along the surface 61a. That is, in the rows L, at least a part of the connection pads 81B, 81E, and 81F is not covered with the ground plane 91. Note that the ground plane 91 may cover at least one of the connection pads 81B, 81E, and 81F in the plurality of rows L in the Z direction.

Furthermore, one of the plurality of connection pads 81 may be electrically connected to a heat-assisted magnetic recording (HAMR) element. The ground plane 91 covers the one of the plurality of connection pads 81 in the Z direction.

Each of the first openings 93 is located between one of the connection pads 81 and the preamplifier 44 in the direction along the surface 61a. That is, in the direction along the surface 61a, a virtual straight line connecting one point in the one of the connection pads 81 and one point in the preamplifier 44 crosses the first opening 93.

Each of the second openings 94 is located between the insertion hole 66 and a closest one of the connection pads 81 relative to the insertion hole 66 in the direction along the surface 61a. That is, in the direction along the surface 61a, a virtual straight line connecting one point in the one of the plurality of connection pads 81, which one is the closest to the insertion hole 66, and one point in the insertion hole 66 crosses the second opening 94.

The ground plane 91 is apart from the plurality of protrusions 63 in the direction along the surface 61a. Thus, both of the ground planes 84 and 91 are apart from the protrusions 63. Note that the ground plane 91 may be provided in the protrusions 63. Furthermore, a conductor such as the wire 89 may be provided in the protrusions 63.

The joint portion 61 further includes a plurality of vias 99. The vias 99 are, for example, through holes. The plurality of vias 99 penetrates through the base layer 71 to connect the ground plane 91 and the corresponding ground planes 84.

At the time of assembling the HDD 1 described above, the pads 55 of the flexures 43 are bonded to the connection pads 81 of the FPC 19 by the solder 87. For example, a paste including the solder 87 is applied to one of the pads 55 or the connection pads 81. Then, the second attachment portions 52 of the flexures 43 and the joint portion 61 of the FPC 19 are overlapped, and the paste is attached to the other of the pads 55 or the connection pads 81.

Then, for example, laser light is emitted to the paste through holes 43a in the flexures 43 in FIG. 5. As a result, the paste is melted, and the pads 55 and the connection pads 81 are bonded together with the solder 87.

When the laser light is emitted to the paste, the paste (solder 87) is heated, and a periphery of the paste is also heated. For example, heat is transferred from the solder 87 to the connection pads 81, and a portion of the FPC 19 which portion is around the connection pads 81 is heated.

In the FPC 19, each of the metal conductive layers 72 and 73 has higher thermal conductivity than any of the base layer 71 and the cover layers 74 and 75. In other words, the conductive layers 72 and 73 easily release heat. Thus, in the FPC 19, a portion where density of the conductive layers 72 and 73 is high is more easily release heat than a portion where the density of the conductive layers 72 and 73 is low.

Density of the wires 83 is high around the preamplifier 44 in the joint portion 61 of the FPC 19. On the other hand, the density of the wires 83 is low around the edge 61*b* of the joint portion 61. Thus, the many wires 83 can release heat around the preamplifier 44.

In general, in a case where the density of the conductive layers 72 and 73 is low around the edge 61*b* of the joint portion 61, a heat release from the portion around the edge 61*b* is difficult. Thus, when irradiated with the laser light under the same condition as that of the portion around the preamplifier 44, the portion around the edge 61*b* may be excessively heated. When the FPC 19 is excessively heated, the conductive layers 72 and 73 may be peeled off from the base layer 71, for example.

On the other hand, the ground planes 84 and 91 are provided around the edge 61*b* in the present embodiment. For example, in the Z direction, the ground plane 91 covers the connection pads 81A placed in the vicinity of the edge 61*b*. As a result, the portion around the edge 61*b* also easily releases heat, and the thermal conductivity in the portion around the edge 61*b* and that in the portion around the preamplifier 44 are more leveled. Thus, even when the laser light is emitted under the same condition as that of the portion around the preamplifier 44, excessive heating of the portion around the edge 61*b* can be suppressed.

The first openings 93 penetrate through the ground plane 91 and prevent heat conduction across the first openings 93. The first openings 93 are placed between the connection pads 81 and the preamplifier 44 and reduce an amount of heat conducted from around the connection pads 81 to around the preamplifier 44. Thus, the first openings 93 can suppress a difficulty in a temperature rise around the connection pads 81F relatively close to the preamplifier 44.

The second openings 94 penetrate through the ground plane 91 and prevent heat conduction across the second openings 94. In addition, the screws 65 are made of metal and have larger volume than the conductive layers 72 and 73. Thus, a portion around the screw 65 easily releases heat. The second openings 94 are placed between the connection pads 81 and the insertion holes 66 and reduce an amount of heat conducted from around the connection pads 81 to around the screws 65. As a result, the second openings 94 can suppress a difficulty in a temperature rise around the connection pads 81F closest to the insertion holes 66.

The plurality of protrusions 63 has a large surface area per volume, and easily releases heat. Since the ground planes 84 and 91 are separated from the protrusions 63, it is possible to suppress a difficulty in a temperature rise around the plurality of protrusions 63.

The ground plane 91 covering the connection pads 81, the mounting pads 82, and the wires 83 in the Z direction may cause parasitic capacitance, leading to occurrence of impedance in the connection pads 81, the mounting pads 82, and the wires 83. The impedance may influence electric signals passing through the connection pads 81, the mounting pads 82, and the wires 83.

On the other hand, in the present embodiment, the ground plane 91 is separated from at least a part of the connection pads 81B, 81E, and 81F and at least a part of a corresponding mounting pad 82 and wire 83 in the direction along the surface 61*a*. That is, the ground plane 91 does not cover at least a part of the conductors through which the write signals, the detection signals, and the read signals pass.

Since the ground plane 91 does not cover the connection pads 81B and the corresponding mounting pads 82 and wires 83, it is possible to suppress generation of an influence of the parasitic capacitance on the write signals. Since the ground plane 91 does not cover the connection pads 81E and the corresponding mounting pads 82 and wires 83, it is possible to suppress generation of an influence of the parasitic capacitance on the detection signals. Furthermore, since the ground plane 91 does not cover the connection pads 81F and the corresponding mounting pads 82 and wires 83, it is possible to suppress generation of an influence of the parasitic capacitance on the read signals.

Note that the ground plane 91 may cover the whole of the connection pads 81B and 81E and the corresponding mounting pads 82 and wires 83 in the Z direction. For example, in a case where the influence of the impedance on the write signals and the detection signals is small, the ground plane 91 covers the whole of the connection pads 81B and 81E and the corresponding mounting pads 82 and wires 83 in the Z direction, and makes a heat release easier.

In the present embodiment, the ground plane 91 is separated in the direction along the surface 61*a* from the whole of the wires 83 connected to the connection pads 81F. On the other hand, in the Z direction, the ground plane 91 may cover a part of the wires 83 connected to the connection pads 81B and 81E. For example, a portion connecting a part and another part of the ground plane 91 may extend in such a manner as to cross a part of the wires 83 connected to the connection pads 81B. As a result, the ground plane 91 can be prevented from differing in potential between the part and another part of the ground plane 91.

In the HDD 1 according to the present embodiment described above, the FPC 19 includes the surface 61*a*, the plurality of connection pads 81 on the surface 61*a*, and the ground plane 91. The plurality of connection pads 81 is individually bonded to the corresponding pads 55 with the solder 87. The ground plane 91 covers at least one of the connection pads 81 in the Z direction orthogonal to the surface 61*a*. Consequently, the ground plane 91 can release heat from the connection pads 81 transferred from the solder 87 heated by a heat source such as laser light, at the time of bonding the connection pads 81 to the pads 55 using the solder 87. Thus, the HDD 1 can avoid the FPC 19 from peeling off, which would otherwise occur due to the overheated connection pads 81. In addition, the plurality of connection pads 81 includes the connection pads 81F. The electric signals (read signals) representing the information read by the magnetic heads 15 from the magnetic disks 12 passes through the connection pads 81F. The ground plane 91 is located apart from at least a part of the connection pads 81F in the direction along the surface 61*a*. Close arrangement between the ground plane and the conductor such as a terminal or a wire through which electric signals pass generally causes impedance in the conductor, affecting the electric signals. If impedance occurs in the connection pads 81F through which the read signals pass, the impedance may influence reading and writing of information from and to the HDD 1. In this regard, occurrence of impedance in the connection pads 81C and 81D will have less influence on reading and writing of information, in the HDD 1. In the HDD 1 of the present embodiment, the ground plane 91 is located apart from the connection pads 81F, thereby preventing occurrence of impedance in the connection pads 81F, which would otherwise occur due to the proximity between the connection pads 81F and the ground plane 91. As a result, the HDD 1 can avoid the ground plane 91 from causing a peel-off of the FPC 19 and affecting the read signals. Thereby, the HDD 1 can be avoided from degrading in performance.

Furthermore, in the HDD 1 according to the present embodiment described above, the FPC 19 includes the surface 61*a*, the plurality of connection pads 81 on the surface 61*a*, the plurality of mounting pads 82 placed on the surface 61a, the plurality of wires 83, and the ground plane 91. The connection pads 81 are individually bonded to the corresponding pads 55 using the solder 87. The wires 83 connect the connection pads 81 and the mounting pads 82. The ground plane 91 covers at least one of the connection pads 81, at least one of the mounting pads 82, and at least one of the wires 83 in the Z direction orthogonal to the surface 61a. Consequently, in bonding the connection pads 81 to the pads 55 using the solder 87, the ground plane 91 can release heat from the connection pads 81 transferred from the solder 87 heated by a heat source such as the laser light. Thus, the HDD 1 can avoid the FPC 19 from peeling off, which would otherwise occur due to the overheated connection pads 81. In addition, the preamplifier 44 is connected to the plurality of mounting pads 82. In the direction along the surface 61a, the ground plane 91 is at least partially apart from one of the wires 83, and one of the connection pads 81 and one of the mounting pads 82 connected to the one of the wires 83. In the HDD 1 of the present embodiment, the ground plane 91 is placed away from the mutually connected connection pads 81, mounting pads 82, and wires 83, therefore, it can be prevented from causing impedance in these connection pads 81, mounting pads 82, and wires 83. Consequently, the HDD 1 can avoid the ground plane 91 from causing a peel-off of the FPC 19, and lower the influence of the ground plane 91 on the electrical signals passing through the connection pads 81, the mounting pads 82, and the wires 83. Thereby, the HDD 1 can be avoided from degrading in performance.

The electric signals (write signals) representing the information to be written to the magnetic disks 12 by the magnetic heads 15 pass through the connection pads 81B. The ground plane 91 is located apart from the connection pads 81B in the direction along the surface 61a. In the HDD 1, the ground plane 91 is apart from the connection pads 81B and is thus prevented from causing impedance in the connection pads 81B, which would otherwise occur due to the proximity between the connection pads 81B and the ground plane 91. Consequently, the HDD 1 can avoid the ground plane 91 from causing a peel-off of the FPC 19, and can lower the influence of the ground plane 91 on the write signals. Thereby, the HDD 1 can be avoided from degrading in performance.

The HDI sensors 45 are mounted on the flexures 43 to detect contact between the magnetic disks 12 and the magnetic heads 15 and output the electric signals (detection signals). The connection pads 81E are electrically connected to the HDI sensors 45. The ground plane 91 is located apart from the connection pads 81E in the direction along the surface 61a. In the HDD 1, the ground plane 91 is apart from the connection pads 81E and is thus prevented from causing impedance in the connection pads 81E, which would otherwise occur due to the proximity between the connection pads 81E and the ground plane 91. Consequently, the HDD 1 can avoid the ground plane 91 from causing a peel-off of the FPC 19, and can lower the influence of the ground plane 91 on the detection signals. Thereby, the HDD 1 can be avoided from degrading in performance.

The plurality of connection pads 81 forms the plurality of rows L. Each of the rows L includes two or more, of the connection pads 81, arranged in the Y direction along the surface 61a. Each row L includes the connection pad 81F. In the direction along the surface 61a, the ground plane 91 is located apart from at least a part of the connection pad 81F in each row L. As a result, the ground plane 91 can be prevented from causing impedance in the connection pad 81F in each row L.

The FPC 19 includes the mounting pads 82 connected to the preamplifier 44, and the wires 83 connecting the connection pads 81F and the mounting pads 82. The ground plane 91 is located apart from at least a part of the mounting pads 82 and the wires 83 in the direction along the surface 61a. As a result, the HDD 1 of the present embodiment can avoid occurrence of impedance in the connection pads 81F, the wires 83, and the mounting pads 82, which would otherwise occur due to the close arrangement between the ground plane 91, and the connection pads 81F, the wires 83, and the mounting pads 82. Thus, the HDD 1 can more effectively lower the influence of the ground plane 91 on the read signals, and can be prevented from degrading in performance.

The ground plane 91 is provided with the holes 92. In the direction along the surface 61a, the connection pads 81F, the wires 83, and the mounting pads 82 are at least partially located inside the edges of the holes 92. That is, the ground plane 91 is located around the connection pads 81F, the wires 83, and the mounting pads 82. As a result, the ground plane 91 can more effectively release heat from the connection pads 81 when bonded to the pads 55. Thereby, the HDD 1 can avoid the FPC 19 from peeling off, which would otherwise occur due to the overheated connection pads 81.

The ground plane 91 is provided with the first openings 93. Each of the first openings 93 is located between one of the connection pads 81 and the preamplifier 44 in the direction along the surface 61a. The first openings 93 can reduce heat transfer between the connection pads 81 and the preamplifier 44 through the ground plane 91. As a result, the HDD 1 of the present embodiment can reduce unevenness in temperature of the connection pads 81, in bonding the connection pads 81 to the pads 55. Thus, the HDD 1 can avoid the FPC 19 from peeling off, which would otherwise occur due to an overheated part of the connection pads 81.

The FPC 19 includes the edge 61b extending in the X direction along the surface 61a, and the protrusions 63 protruding from the edge 61b in the Y direction along the surface 61a and intersecting with the X direction. The plurality of connection pads 81 is located between the edge 61b and the preamplifier 44 in the direction along the surface 61a. The ground plane 91 is located apart from the protrusions 63 in the direction along the surface 61a. The protrusions 63 protruding from the edge 61b more easily release heat than the joint portion 61 including the edge 61b of the FPC 19. Because of the location apart from the protrusions 63, the ground plane 91 is prevented from causing the protrusions 63 to excessively release heat. Thus, the HDD 1 of the present embodiment can reduce unevenness in temperature of the FPC 19 at the time of bonding the connection pads 81 to the pads 55. Consequently, the HDD 1 can avoid the FPC 19 from peeling off, which would otherwise occur due to an overheated part of the connection pads 81.

The FPC 19 includes the base layer 71, and the conductive layer 72 laminated on the base layer 71. The conductive layer 72 includes the connection pads 81, and the ground planes 84 apart from the connection pads 81 in the direction along the surface 61a. Each ground plane 84 is at least partially located between two of the connection pads 81 in the direction along the surface 61a. That is, the ground planes 84 are located in the vicinity of the connection pads 81. As a result, the ground planes 84 can release heat from the connection pads 81 when joined to the pads 55. Thus, the HDD 1 can avoid the FPC 19 from peeling off, which would otherwise occur due to the overheated connection pads 81.

The FPC 19 includes the vias 99 that connect the ground plane 91 and the ground planes 84. As a result, in the HDD 1 of the present embodiment, the ground plane 91 and the ground planes 84 can be all set to the same potential. Thus, the HDD 1 can avoid the ground plane 91 and the ground planes 84 from functioning as antennas and/or causing undesirable impedance and/or noise. Thereby, the HDD 1 can be prevented from deteriorating in performance.

The FPC 19 is provided with the insertion holes 66 through which the screws 65 are inserted. The ground plane 91 is provided with the second openings 94. Each of the second openings 94 is located between a closest one of the connection pads 81 relative to one of the insertion holes 66, and the one insertion hole 66 in the direction along the surface 61a. The second openings 94 can reduce heat transfer through the ground plane 91 between the connection pads 81 and the screws 65 inserted through the insertion holes 66. As a result, the HDD 1 of the present embodiment can reduce unevenness in temperature of the connection pads 81 when joined to the pads 55. Thereby, the HDD 1 can avoid the FPC 19 from peeling off, which would otherwise occur due to an overheated part of the connection pads 81.

In the above description, "prevent" is defined as, for example, preventing generation of an event, an action, or an influence, or reducing a degree of the event, the action, or the influence.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
    a magnetic disk;
    a magnetic head configured to read and write information from and to the magnetic disk;
    a first flexible printed circuit board including a plurality of first terminals, on which the magnetic head is mounted and electrically connected to at least one of the plurality of first terminals;
    a second flexible printed circuit board including
        a surface,
        a plurality of second terminals on the surface, individually bonded to the corresponding first terminals with a conductive bonding material, and
        a first ground plane covering at least one of the plurality of second terminals in a direction orthogonal to the surface; and
    a preamplifier mounted on the second flexible printed circuit board, configured to
        output, to the magnetic head, an electric signal representing information to be written to the magnetic disk by the magnetic head, and
        receive, from the magnetic head, an electric signal representing information read from the magnetic disk by the magnetic head,
    wherein
    the plurality of second terminals includes a first read terminal through which an electric signal representing information read from the magnetic disk by the magnetic head passes,
    the first ground plane is located apart from at least a part of the first read terminal in a direction along the surface,
    the second flexible printed circuit board includes a second read terminal connected to the preamplifier, and lead wiring connecting the first read terminal and the second read terminal,
    the first ground plane is provided with a hole, and
    the first read terminal, the lead wiring, and the second read terminal are at least partially located inside an edge of the hole in the direction along the surface.

2. The disk device according to claim 1, wherein
    the plurality of second terminals includes a write terminal through which an electric signal representing information to be written into the magnetic disk by the magnetic head passes, and
    the first ground plane is located apart from the write terminal in the direction along the surface.

3. The disk device according to claim 1, further comprising:
    an HDI sensor that detects contact between the magnetic disk and the magnetic head and outputs an electric signal, wherein
    the plurality of second terminals includes an HDI terminal electrically connected to the HDI sensor, and
    the first ground plane is located apart from the HDI terminal in the direction along the surface.

4. The disk device according to claim 1, wherein
    the plurality of second terminals forms a plurality of rows, each of the rows including two or more second terminals arranged in a first direction along the surface among the plurality of second terminals, and
    each of the plurality of rows includes the first read terminal, and
    in the direction along the surface, the first ground plane is apart from at least a part of the first read terminal in each of the plurality of rows.

5. The disk device according to claim 1, wherein
    the first ground plane is located apart from at least a part of the second read terminal and the lead wiring in the direction along the surface.

6. The disk device according to claim 1, wherein
    the second flexible printed circuit board includes
        an edge extending in a second direction along the surface, and
        a protrusion protruding from the edge in a third direction along the surface and intersecting with the second direction,
    the plurality of second terminals is located between the edge and the preamplifier in the direction along the surface, and
    the first ground plane is located apart from the protrusion in the direction along the surface.

7. The disk device according to claim 1, wherein
    the second flexible printed circuit board is provided with an insertion hole through which a screw is inserted, and
    the first ground plane is provided with a second opening between the insertion hole and a closest one of the plurality of second terminals relative to the insertion hole in the direction along the surface.

8. A disk device comprising:
    a magnetic disk;
    a magnetic head configured to read and write information from and to the magnetic disk;

a first flexible printed circuit board including a plurality of first terminals, on which the magnetic head is mounted and electrically connected to at least one of the plurality of first terminals;
a second flexible printed circuit board including
a surface,
a plurality of second terminals on the surface, individually bonded to the corresponding first terminals with a conductive bonding material,
a plurality of third terminals on the surface,
a plurality of wires connecting the plurality of second terminals and the plurality of third terminals, and
a first ground plane covering at least one of the plurality of second terminals, at least one of the plurality of third terminals, and at least one of the plurality of wires in a direction orthogonal to the surface; and
a preamplifier connected to the plurality of third terminals, configured to
output, to the magnetic head, an electric signal representing information to be written to the magnetic disk by the magnetic head, and
receive, from the magnetic head, an electric signal representing information read from the magnetic disk by the magnetic head, wherein
in a direction along the surface, the first ground plane is at least partially apart from one of the plurality of wires, one of the plurality of second terminals, one of the plurality of third terminals, the one of the plurality of second terminals and the one of the plurality of third terminals being connected to the one of the plurality of wires.

9. A disk device comprising:
a magnetic disk;
a magnetic head configured to read and write information from and to the magnetic disk;
a first flexible printed circuit board including a plurality of first terminals, on which the magnetic head is mounted and electrically connected to at least one of the plurality of first terminals;
a second flexible printed circuit board including
a surface,
a plurality of second terminals on the surface, individually bonded to the corresponding first terminals with a conductive bonding material, and
a first ground plane covering at least one of the plurality of second terminals in a direction orthogonal to the surface; and
a preamplifier mounted on the second flexible printed circuit board, configured to
output, to the magnetic head, an electric signal representing information to be written to the magnetic disk by the magnetic head, and
receive, from the magnetic head, an electric signal representing information read from the magnetic disk by the magnetic head,
wherein
the plurality of second terminals includes a first read terminal through which an electric signal representing information read from the magnetic disk by the magnetic head passes,
the first ground plane is located apart from at least a part of the first read terminal in a direction along the surface, and
the first ground plane is provided with a first opening between one of the plurality of second terminals and the preamplifier in the direction along the surface.

10. A disk device comprising:
a magnetic disk;
a magnetic head configured to read and write information from and to the magnetic disk;
a first flexible printed circuit board including a plurality of first terminals, on which the magnetic head is mounted and electrically connected to at least one of the plurality of first terminals; and
a second flexible printed circuit board including
a surface,
a plurality of second terminals on the surface, individually bonded to the corresponding first terminals with a conductive bonding material, and
a first ground plane covering at least one of the plurality of second terminals in a direction orthogonal to the surface,
wherein
the plurality of second terminals includes a first read terminal through which an electric signal representing information read from the magnetic disk by the magnetic head passes,
the first ground plane is located apart from at least a part of the first read terminal in a direction along the surface,
the second flexible printed circuit board includes a base layer, and a conductive layer laminated on the base layer, and
the conductive layer includes
the plurality of second terminals, and
a second ground plane located apart from the plurality of second terminals in the direction along the surface, and
at least a part of the second ground plane is located between two of the plurality of second terminals in the direction along the surface.

11. The disk device according to claim 10, wherein
the second flexible printed circuit board is provided with a via connecting the first ground plane and the second ground plane.

* * * * *